(12) United States Patent
Huang et al.

(10) Patent No.: US 8,710,633 B2
(45) Date of Patent: Apr. 29, 2014

(54) SEMICONDUCTOR OVERLAPPED PN STRUCTURE AND MANUFACTURING METHOD THEREOF

(71) Applicants: Tsung-Yi Huang, Hsinchu (TW); Chien-Hao Huang, Magong (TW); Ying-Shiou Lin, Chiayi (TW)

(72) Inventors: Tsung-Yi Huang, Hsinchu (TW); Chien-Hao Huang, Magong (TW); Ying-Shiou Lin, Chiayi (TW)

(73) Assignee: Richtek Technology Corporation, Chupei, Hsin-Chu (TW)

( * ) Notice: Subject to any disclaimer, the term of this patent is extended or adjusted under 35 U.S.C. 154(b) by 0 days.

(21) Appl. No.: 13/864,196

(22) Filed: Apr. 16, 2013

(65) Prior Publication Data
US 2013/0256846 A1    Oct. 3, 2013

Related U.S. Application Data

(62) Division of application No. 13/090,449, filed on Apr. 20, 2011, now Pat. No. 8,524,586.

(51) Int. Cl.
*H01L 29/06*      (2006.01)

(52) U.S. Cl.
USPC .... 257/655; 257/653; 257/654; 257/E29.002; 257/E21.334; 438/527; 438/531

(58) Field of Classification Search
CPC ....... H01L 29/06; H01L 29/00; H01L 29/861; H01L 21/00; H01L 29/66136; H01L 29/8611; H01L 21/31662; H01L 23/485; H01L 27/00; H01L 29/36; H01L 21/26513; H01L 21/3221
USPC .......... 257/655, E29.002, E21.334, 653, 654, 257/656; 438/527, 531
See application file for complete search history.

(56) References Cited

U.S. PATENT DOCUMENTS

| | | | | |
|---|---|---|---|---|
| 3,548,269 A | * | 12/1970 | Macdougall et al. | 257/469 |
| 4,683,485 A | * | 7/1987 | Schrantz | 257/285 |

* cited by examiner

*Primary Examiner* — Thinh T Nguyen
(74) *Attorney, Agent, or Firm* — Tung & Associates

(57) ABSTRACT

The present invention discloses a semiconductor overlapped PN structure and manufacturing method thereof. The method includes: providing a substrate; providing a first mask to define a P (or N) type well and at least one overlapped region in the substrate; implanting P (or N) type impurities into the P (or N) type well and the at least one overlapped region; providing a second mask having at least one opening to define an N (or P) type well in the substrate, and to define at least one dual-implanted region in the at least one overlapped region; implanting N (or P) type impurities into the N (or P) type well and the at least one dual-implanted region such that the at least one dual-implanted region has P type and N type impurities.

4 Claims, 4 Drawing Sheets

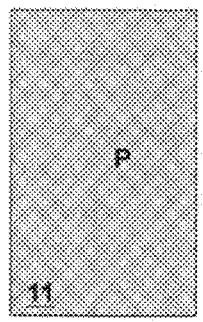 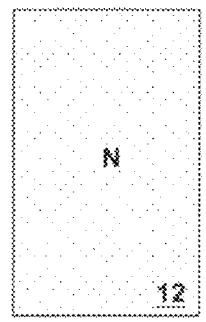 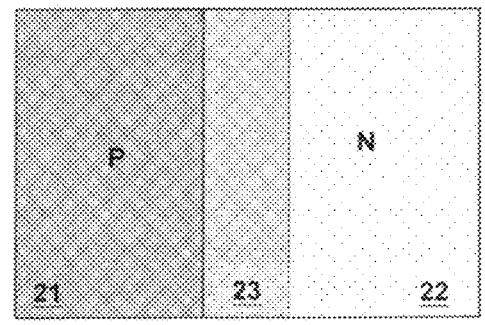
Fig. 1 (Prior Art)　　　　Fig. 2 (Prior Art)
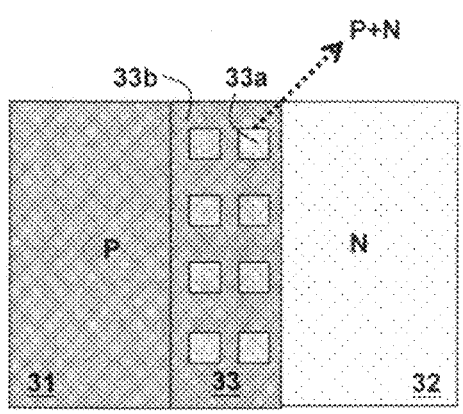
Fig. 3A
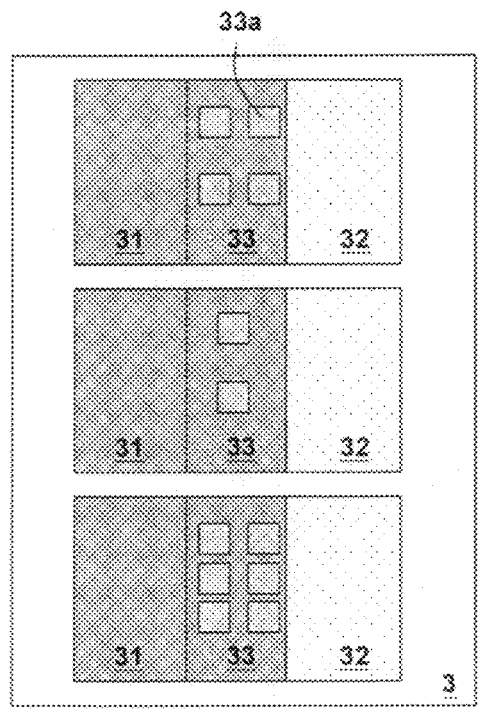
Fig. 3B

SEMICONDUCTOR OVERLAPPED PN STRUCTURE AND MANUFACTURING METHOD THEREOF

This is a Divisional of a co-pending application Ser. No. 13/090,449, filed on Apr. 20, 2011.

BACKGROUND OF THE INVENTION

1. Field of Invention

The present invention relates to a semiconductor overlapped PN structure and a manufacturing method thereof, in particular to such structure and method that provide flexibility for adjusting breakdown voltages of semiconductor devices.

2. Description of Related Art

It is often required for a semiconductor device to be implanted with P type impurities and N type impurities in a substrate. FIG. 1 illustrates by top view, a prior art impurities implanted region in a substrate, which can be used in a high voltage device. As shown in the figure, the impurities implanted region includes a P type well 11 and an N type well 12 separated from each other; that is, the region implanted with the P type impurities does not overlap with the region implanted with the N type impurities. During a diffusion process after the implantation process, ions of the P type well 11 and ions of the N type well 12 will diffuse toward each other to form a diffusion region 13 between the P type well 11 and the N type well 12. The concentration of the P type impurities and the N impurities in the diffusion region 13 determines a breakdown voltage of the semiconductor device. Different devices may require different breakdown voltages, but due to limitations resulting from transistor device design, there is not too much room to adjust the concentration of the P type impurities and the N type impurities. Thus, if it is required to provide different devices with different breakdown voltages in the same wafer, one has to use additional masks and perform one or more additional ion implantation processes so that different diffusion regions 13 can be formed for different devices. As such, the manufacturing process is more complex which involves a higher cost, and the complexity and cost further increase as the number of the devices in a wafer increases.

FIG. 2 illustrates by top view, another prior art impurities implanted region in the substrate, wherein the impurities implanted region includes a P type well 21 and an N type well 22 which overlap with each other to form an overlapped region 23; that is, two regions respectively implanted with the P type impurities and the N type impurities overlap with each other, so the overlapped region 23 is implanted with both the P type and N type impurities. Similarly, if it is required to provide different devices with different breakdown voltages in the same wafer, one has to use additional masks and perform one or more additional ion implantation processes so that different overlapped regions 23 can be formed for different devices. As such, the prior art also requires a more complex manufacturing process and higher cost.

In view of above, to overcome the drawbacks in the prior art, the present invention proposes a semiconductor overlapped PN structure and a manufacturing method thereof which flexibly provide different devices with different breakdown voltages in the same wafer, in which it is not required to adjust the concentration of the impurities or increase any additional mask and ion implantation process.

SUMMARY OF THE INVENTION

The objectives of the present invention are to provide a semiconductor overlapped PN structure and a manufacturing method thereof.

To achieve the foregoing objectives, the present invention provides a semiconductor overlapped PN structure comprising: a substrate; a P type well in the substrate; an N type well in the substrate; and at least one overlapped region between the P type well and the N type well, the at least one overlapped region including: at least one dual-implanted region having P type and N type impurities; and at least one single-implanted region having the P type or the N type impurities.

In the foregoing semiconductor overlapped PN structure, the number of the at least one dual-implanted region may be plural, and from top view, the dual-implanted regions may have shapes of squares, circles, polygons, or combinations thereof.

In the foregoing semiconductor overlapped PN structure, the at least one overlapped region may interface with the P type well or the N type well to form a junction, and from top view, the junction may include one or more of the following shapes: rectangle-shape, wave-shape, jag-shape and arc-shape.

The foregoing semiconductor overlapped PN structure may further comprise a diffusion region between the at least one overlapped region and the P type well or between the at least one overlapped region and the N type well.

In the foregoing semiconductor overlapped PN structure, the number of the at least one overlapped region may be plural, and one of the plural overlapped regions may have a ratio of the P type impurities to the N type impurities which is different from that of at least another overlapped region.

In another perspective of the present invention, it provides a method for manufacturing a semiconductor overlapped PN structure, comprising: providing a substrate; providing a first mask to define a first type well and at least one overlapped region in the substrate; implanting first type impurities into the first type well and the at least one overlapped region; providing a second mask having at least one opening to define a second type well in the substrate, and to define at least one dual-implanted region in the at least one overlapped region; and implanting second type impurities into the second type well and the at least one dual-implanted region such that the at least one dual-implanted region has the first type and the second type impurities.

The objectives, technical details, features, and effects of the present invention will be better understood with regard to the detailed description of the embodiments below, with reference to the drawings.

BRIEF DESCRIPTION OF THE DRAWINGS

FIG. 1 shows, by top view, a prior art PN structure for use in a high voltage device.

FIG. 2 shows, by top view, another prior art PN structure for use in a high voltage device.

FIG. 3A shows, by top view, a semiconductor overlapped PN structure according to a first embodiment of the present invention.

FIG. 3B shows that the present invention provides different devices with different breakdown voltages by adjusting the dual-implanted regions 33a in the overlapped region 33.

DESCRIPTION OF THE PREFERRED EMBODIMENTS

Figure 4A:
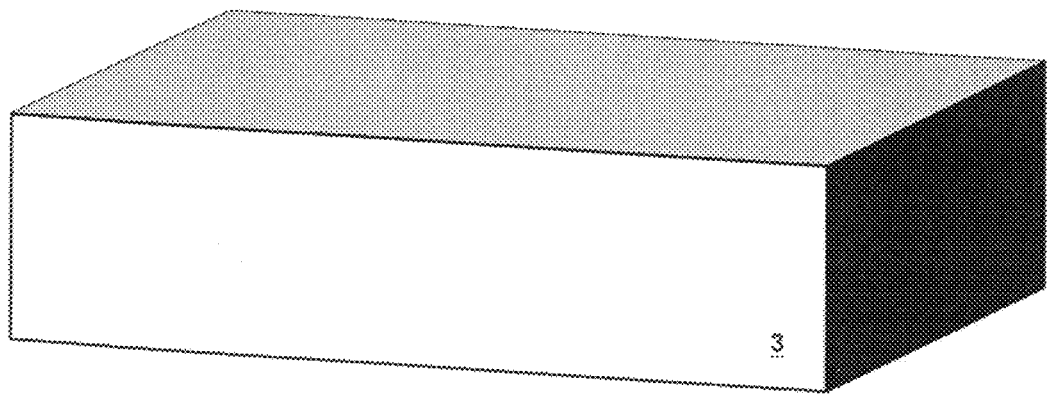
FIGS. 4A-4C illustrate a manufacturing process for the semiconductor overlapped PN structure of the first embodiment of the present invention.

The drawings as referred to throughout the description of the present invention are for illustration only, to show the interrelations between the regions and the process steps, but not drawn according to actual scale.

FIG. 3A shows, by top view, a semiconductor overlapped PN structure in a first embodiment according to the present invention. As shown in the figure, the semiconductor overlapped PN structure includes a P type well 31, an N type well 32 and an overlapped region 33, wherein the overlapped region 33 includes dual-implanted regions 33a having both P type and N type impurities and a single-implanted region 33b having the P type impurities. FIG. 3A shows the distribution of the impurities while the impurities are just implanted into the semiconductor overlapped PN structure; during a diffusion process after the implantation process, the P type impurities and the N type impurities may diffuse so that the final distribution of the impurities in the overlapped region 33 may be more uniform than what is shown in the figure. It can be understood from the figure that when the number, shape, size, or arrangement of the dual-implanted regions 33a changes, the ratio of the P type impurities to the N type impurities also changes accordingly, that is, the breakdown voltage of a device formed over the overlapped region 33 can be adjusted accordingly. Thus, if it is required to provide different devices with different breakdown voltages in the same wafer, as shown in FIG. 3B, the requirement can be achieved by respectively adjusting the number, shape, size, or arrangement of the dual-implanted regions 33a at different locations in the wafer, corresponding to different devices, and it is not required to increase any additional mask and ion implantation process or adjust the concentration of the impurities. In other words, the present invention provides each different device with a respective ratio of the P type impurities to the N type impurities so that different devices have different breakdown voltages, by respectively defining the number, shape, size, or arrangement of the dual-implanted regions 33a in each device through one same mask.

Figure 4B:
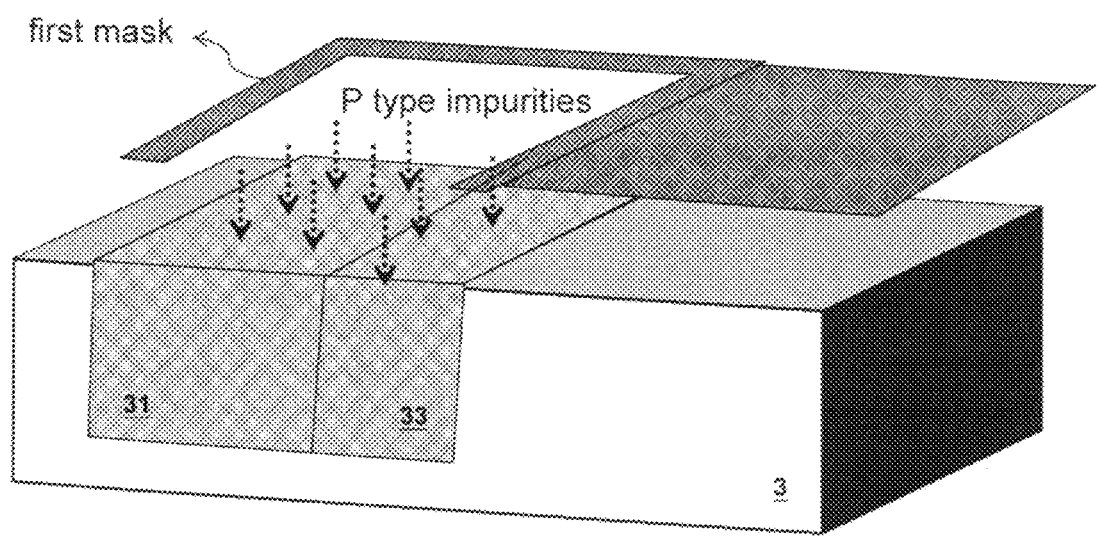
Figure 4C:
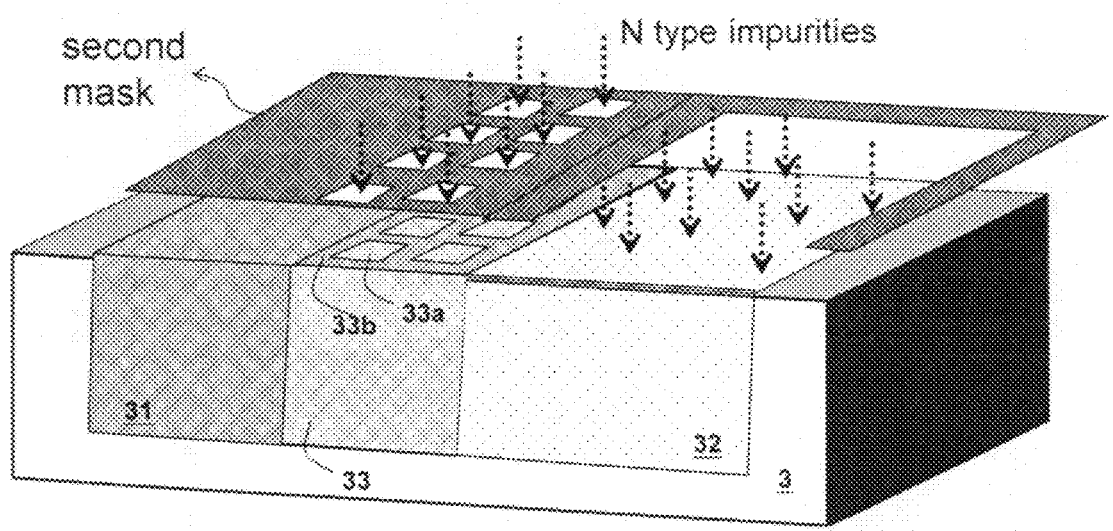

FIGS. 4A-4C illustrate a manufacturing process for the semiconductor overlapped PN structure in the first embodiment of the present invention. First, a substrate 3 is provided as shown in FIG. 4A. Next, as shown in FIG. 4B, the P type well 31 and the overlapped region 33 are defined by a first mask, and the P type well 31 and the overlapped region 33 are implanted with the P type impurities. Finally, as shown in FIG. 4C, the N type well 32 and the dual-implanted regions 33a are defined by a second mask having multiple openings, and the N type well 32 and the dual-implanted regions 33a are implanted with the N type impurities so that the dual-implanted regions 33a have both the P type and N type impurities, wherein in the overlapped region 33, the region not implanted with the N type impurities is the single-implanted region 33b.

Figure 4D:
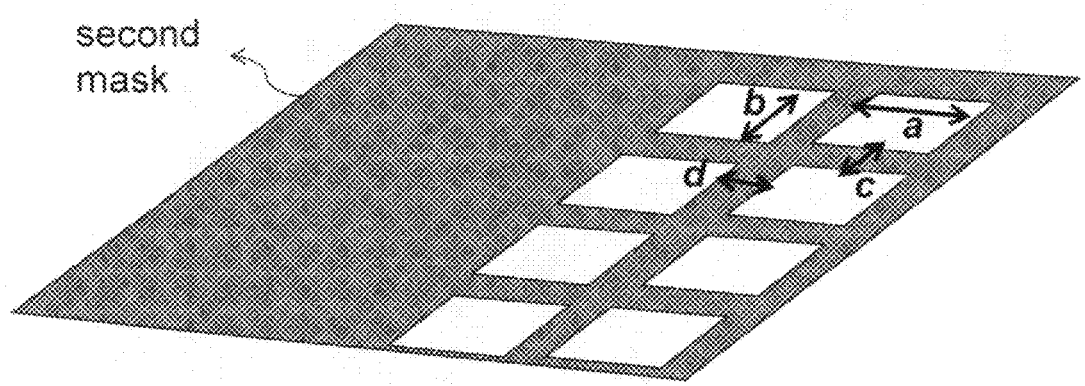
FIG. 4D shows that the openings of the second mask can be flexibly adjusted according to the present invention.

As shown in FIG. 4D, the present invention can adjust the length a, width b, spaces c and d of the openings in the second mask (certainly, the shape and number of the openings are also adjustable) to adjust the area and distribution of the N type impurities so that different devices can have different breakdown voltages even though the impurities are implanted with the same concentration.

Figure 5A:
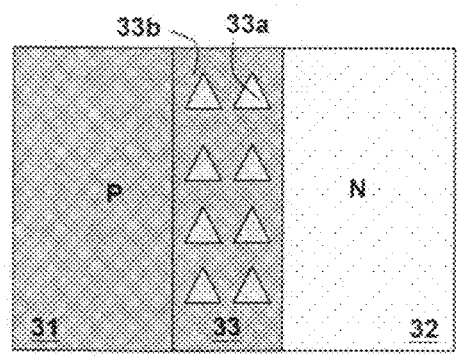
FIG. 5A shows, by top view, another embodiment of the semiconductor overlapped PN structure according to the present invention.
Figure 5B:
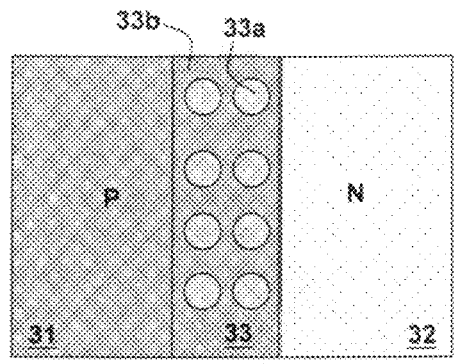
FIG. 5B shows, by top view, another embodiment of the semiconductor overlapped PN structure according to the present invention.
Figure 5C:
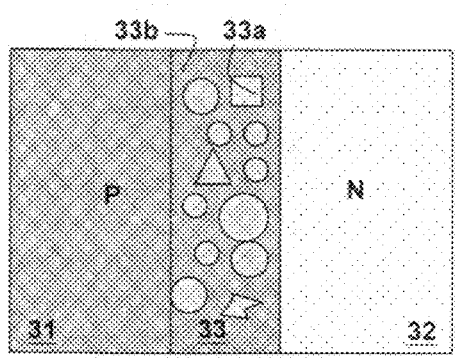
FIG. 5C shows, by top view, another embodiment of the semiconductor overlapped PN structure according to the present invention.
Figure 5D:
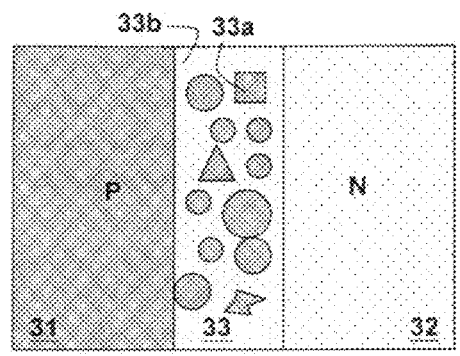
FIG. 5D shows, by top view, another embodiment of the semiconductor overlapped PN structure according to the present invention.
Figure 5E:
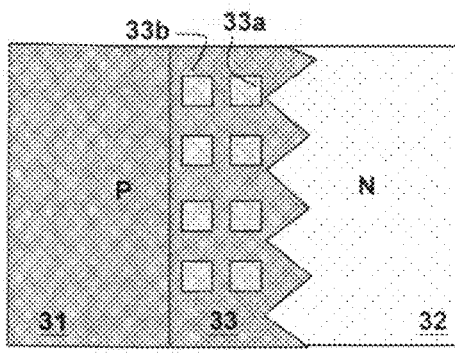
FIG. 5E shows, by top view, another embodiment of the semiconductor overlapped PN structure according to the present invention.
Figure 5F:
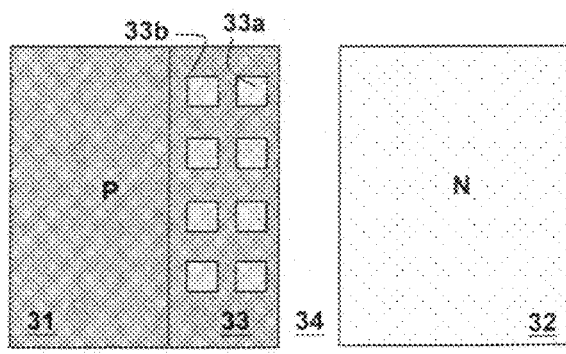
FIG. 5F shows, by top view, another embodiment of the semiconductor overlapped PN structure according to the present invention.

FIGS. 5A-5F show by way of example, top views of other embodiments with different shapes or distributions according to the present invention. As shown in FIGS. 5A-5C, the dual-implanted regions 33a in the present invention may not only have shapes of squares, but also have shapes of, for example but not limited to, triangles, circles, polygons, or combinations thereof. As shown in FIG. 5D, the dual-implanted regions 33a have both the P type and N type impurities, and the single-implanted region 33b can be an N type region instead of a P type region. As shown in FIG. 5E, the P type well 31 can interface with the N type well to form a regularly-shaped or irregularly-shaped junction, instead of a smooth junction as shown in FIG. 3. As shown in FIG. 5F, the semiconductor overlapped PN structure of the present invention may also include a diffusion region 34 between the overlapped region 33 and the N type well 32 (or between the overlapped region 33 and the P type well 31, or both); that is, the present invention may also include a region not defined by the openings of both the first mask and the second mask during the processes shown in FIGS. 4A-4D, and the region between the openings is the diffusion region 34.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other manufacturing process steps or structures which do not affect the characteristics of the devices, such as a deep-well region, etc., can be added. As another example, the lithography process is not limited to photolithography; it can be electron beam lithography, X-ray lithography or other methods. As yet another example, the semiconductor substrate may be P type or N type, and in this case, it is not absolutely necessary for the semiconductor overlapped PN structure to be formed by implanting two different conductive type impurities; in some cases, the semiconductor overlapped PN structure may be formed just by implanting the impurities opposite to the conductive type of the semiconductor substrate. Thus, the present invention should cover all such and other modifications and variations, which should be interpreted to fall within the scope of the following claims and their equivalents.

What is claimed is:

1. A semiconductor overlapped PN structure comprising:
a substrate;
a P type well in the substrate;
an N type well in the substrate; and
at least one overlapped region between the P type well and the N type well, the at least one overlapped region occupying a first area inside which there are a plurality of second areas smaller than the first area, wherein the first area contains impurities of a first conductivity type, and each of the second areas contains, in addition to the impurities of the first conductivity type, impurities of a second conductivity type which is opposite to the first conductivity type, wherein the first conductivity type is P type or N type.

2. The semiconductor overlapped PN structure of claim 1, wherein the second areas have shapes of squares, circles, polygons, or combinations thereof.

3. The semiconductor overlapped PN structure of claim 1, wherein the number of the at least one overlapped region is plural, and one of the plural overlapped regions has a ratio of the P type impurities to the N type impurities which is different from that of at least another overlapped region.

4. The semiconductor overlapped PN structure of claim 1, further comprising a diffusion region between the at least one overlapped region and the P type well or between the at least one overlapped region and the N type well.

* * * * *